United States Patent
Tsutsui et al.

(10) Patent No.: US 7,504,049 B2
(45) Date of Patent: Mar. 17, 2009

(54) ELECTRODE DEVICE FOR ORGANIC DEVICE, ELECTRONIC DEVICE HAVING ELECTRODE DEVICE FOR ORGANIC DEVICE, AND METHOD OF FORMING ELECTRODE DEVICE FOR ORGANIC DEVICE

(75) Inventors: Tetsuo Tsutsui, Fukuoka (JP); Daisuke Kumaki, Kanagawa (JP)

(73) Assignee: Semiconductor Energy Laboratory Co., Ltd., Kanagawa-Ken, Atsugi-shi (JP)

( * ) Notice: Subject to any disclaimer, the term of this patent is extended or adjusted under 35 U.S.C. 154(b) by 377 days.

(21) Appl. No.: 10/919,334

(22) Filed: Aug. 17, 2004

(65) Prior Publication Data

US 2005/0123751 A1    Jun. 9, 2005

(30) Foreign Application Priority Data

Aug. 25, 2003    (JP)    ............................. 2003-299442

(51) Int. Cl.
*H01B 1/00*    (2006.01)
(52) U.S. Cl. ...................... 252/500; 257/123; 257/666; 313/498; 313/506; 315/169.3; 429/209; 429/213
(58) Field of Classification Search ................. 252/514, 252/511, 500; 313/504, 498, 506; 525/279; 257/666, 123; 315/169.3; 429/209, 213
See application file for complete search history.

(56) References Cited

U.S. PATENT DOCUMENTS 4,552,927 A * 11/1985 Warren ........................ 525/279
5,364,654 A    11/1994 Hosokawa et al.
5,458,977 A    10/1995 Hosokawa et al.

(Continued)

FOREIGN PATENT DOCUMENTS

EP    0 461 542    12/1991

(Continued)

OTHER PUBLICATIONS

Kido et al., "Bright organic electroluminescent devices having a metal-doped electron-injecting layer," App. Phys. Letters, vol. 73, No. 20, Nov. 16, 1988, pp. 2866-2868.*

(Continued)

*Primary Examiner*—Douglas Mc Ginty
*Assistant Examiner*—Khanh Tuan Nguyen
(74) *Attorney, Agent, or Firm*—Fish & Richardson P.C.

(57) ABSTRACT

To provide an electrode for an organic device which can realize a hole injection function and/or an electron injection function from a totally different point of view from metal donor doping. A composite material in which conductive particles of a particulate conductive inorganic compound (the diameter is 1 (nm) to 100 (nm), preferably, 1 (nm) to 20 (nm)) are dispersed in one or plural kinds of organic compounds 101 is layered on a surface of an organic layer 110 of an organic device where an electrode is to be formed to form an electrode for an organic device 100. As to the thus formed electrode, since the densely dispersed conductive particles 102 have large specific surface area, interaction between the conductive particles 102 and the organic compound 101 realizes a function of a donor or an acceptor. Besides, since adhesion with the organic layer 110 is high for the existence of the matrix of the organic compound 101, the electrode is suitable for an organic device.

18 Claims, 5 Drawing Sheets

U.S. PATENT DOCUMENTS

| | | | |
|---|---|---|---|
| 5,757,139 | A | 5/1998 | Forrest et al. |
| 6,013,384 | A | 1/2000 | Kido et al. |
| 6,107,734 | A | 8/2000 | Tanaka et al. |
| 6,245,458 | B1 * | 6/2001 | Sotomura ............... 429/213 |
| 6,486,601 | B1 | 11/2002 | Sakai et al. |
| 6,651,871 | B2 * | 11/2003 | Ogure .................. 228/248.1 |
| 6,717,358 | B1 | 4/2004 | Liao et al. |
| 6,872,472 | B2 | 3/2005 | Liao et al. |
| 6,876,007 | B2 | 4/2005 | Yamazaki et al. |
| 6,914,272 | B2 | 7/2005 | Goetz et al. |
| 7,226,695 | B2 * | 6/2007 | Takeuchi et al. ........... 429/209 |
| 7,239,081 | B2 | 7/2007 | Tsutsui |
| 2002/0180349 | A1 * | 12/2002 | Aziz et al. ............... 313/506 |
| 2003/0094612 | A1 | 5/2003 | Yamazaki et al. |
| 2003/0127967 | A1 * | 7/2003 | Tsutsui et al. ............. 313/498 |
| 2003/0170491 | A1 * | 9/2003 | Liao et al. ............... 428/690 |
| 2003/0189401 | A1 | 10/2003 | Kido et al. |
| 2003/0218166 | A1 | 11/2003 | Tsutsui |
| 2004/0027059 | A1 | 2/2004 | Tsutsui |
| 2004/0123804 | A1 | 7/2004 | Yamazaki et al. |
| 2004/0124505 | A1 * | 7/2004 | Mahle et al. ............... 257/666 |
| 2004/0139914 | A1 | 7/2004 | Yamazaki et al. |
| 2004/0150333 | A1 | 8/2004 | Tsutsui |
| 2004/0245541 | A1 | 12/2004 | Shitagaki et al. |
| 2005/0012456 | A1 | 1/2005 | Nakatsu et al. |
| 2005/0133783 | A1 | 6/2005 | Yamazaki et al. |
| 2005/0134173 | A1 | 6/2005 | Tsutsui et al. |
| 2005/0156197 | A1 | 7/2005 | Tsutsui et al. |
| 2006/0091797 | A1 | 5/2006 | Tsutsui et al. |

FOREIGN PATENT DOCUMENTS

| | | | |
|---|---|---|---|
| EP | 0 855 848 A2 | | 7/1998 |
| EP | 1 009 198 | | 6/2000 |
| EP | 1 388 903 | | 2/2004 |
| JP | 04-230997 | | 8/1992 |
| JP | 06-188074 | | 7/1994 |
| JP | 10-270171 | | 10/1998 |
| JP | 11-015408 | | 1/1999 |
| JP | 200-082467 | * | 3/2000 |
| JP | 2000-260572 | | 9/2000 |
| JP | 2000-315581 | * | 11/2000 |
| JP | 2003-045676 | | 2/2003 |
| JP | 2004-095549 | | 3/2004 |
| WO | WO00-01203 | | 1/2000 |

OTHER PUBLICATIONS

International Search Report (Application No. PCT/JP2004/012440) in Japanese, Dec. 28, 2004, 5 pages.

International Written Opinion (Application No. PCT/JP2004/012440) in Japanese, Dec. 28, 2004, 6 pages.

International Written Opinion (Application No. PCT/JP2004/012457; PCT7306); partial translation; pp. 1-2; Dec. 28, 2004.

U.S. Patent Application filed concurrently herewith (Tetsuo Tsutsui et al.; "Electrode Device for Organic Device and Electrode Device Having the Same"; filed Aug. 17, 2004).

L.S. Hung et al.; "Enhanced electron injection in organic electroluminescence devices using an Al/LiF electrode"; *Applied Physics Letters* 70(2); pp.152-154; 1997.

Kido, J. et al., "High Quantum Efficiency Organic EL Devices Having Charge Generation Layer,", 49th Japan Society of Applied Physics and Related Societies, Mar. 1, 2002, No. 3, pp. 1308/27P-YL-3.

"International Search Report (Application No. PCT/JP2004/012440; PCT7210) Dated Dec. 28, 2004,".

"Written Opinion (Application No. PCT/JP2004/012440; PCT7210)Dated Dec. 28, 2004,".

* cited by examiner

ELECTRODE DEVICE FOR ORGANIC DEVICE, ELECTRONIC DEVICE HAVING ELECTRODE DEVICE FOR ORGANIC DEVICE, AND METHOD OF FORMING ELECTRODE DEVICE FOR ORGANIC DEVICE

TECHNICAL FIELD

The present invention relates to an electrode for an organic device used for an organic device such as an EL element, FET, which use the properties of an organic compound; an electronic device having the electrode for an organic device; and a method of forming the electrode for an organic device.

BACKGROUND ART

Since an electrode of an organic device serves as a contact point where an organic compound which indicates a function of the device is connected with an inorganic compound such as a wiring, the electrode is very important and various refinements are applied. For example, as an electron injection electrode of an organic EL element, a technology of doping a metal such as an alkali metal having low work function is effective (See Patent Literature 1). As to the technology, a metal is made to serve as a donor, and the metal and an organic compound composes a charge-transfer complex; thus, electron injection properties are improved. Accordingly, the ratio of the metal and the organic compound is supposed to be optimum at about 1:1 in molar ratio (See Non-patent Literature 1).

[Patent document 1] Japanese Patent Laid-Open No. 10-270171

[Non-patent Literature] Applied Physics letters, "Bright Organic Electroluminescent Devices Having Metal-Doped Electron-Injecting Layer" America, Institute of Physics, November 1998, Vol. 70, No. 2, pp. 152-154, J. Kido et al.

An electrode for an organic device described above is manufactured by a method in which an organic compound and a metal are respectively evaporated by resistance heating, and mixed and deposited in the gas phase (what is called a co-evaporation method). On this occasion, the ratio of the organic compound and the metal is monitored with crystal oscillator to be monitored by weight. In general, most of organic compounds used for the organic device have molecular weight of more than hundreds (for example, the molecular weight of Alq used in the Non-patent Literature 1 is 459). Meanwhile, atomic weight of metal is extremely small compared to that (for example, the atomic weight of Li is 7). Accordingly, in the case where the ratio of the metal and the organic compound is about 1:1, the ratio of the metal by weight is very low.

Hence, in the case of forming an electrode for an organic device so that a metal and an organic compound compose a charge transfer complex, it has been difficult to manufacture a stable and uniform device because of bad controllability of the deposition rate of the metal. Further, in particular, most of semiconducting or conductive inorganic compounds (semiconducting/conductive oxide and the like) other than metal has low vapor pressure and are difficult to evaporate by resistance heating; therefore, an electrode for an organic device in which those are mixed with the organic compound could not be formed.

DISCLOSURE OF THE INVENTION

Problem to be Solved by the Invention

The present invention provides an electrode for an organic device which realize an electron injection function and/or a hole injection function from a totally different point of view from metal donor doping. Further, the present invention provides a method of forming an electrode for an organic device by which a stable and uniform electrode can be formed from the properties of the electrode for an organic device according to the invention.

Means to Solve the Problem

In order to solve the above problems, as to an electrode for an organic device according to the invention, in the case of an electrode for an organic device used for an organic device that is a functional element using the properties of an organic compound, a composite material in which conductive particles of a particulate conductive inorganic compound are dispersed in a matrix including one or plural kinds of organic compounds. Using the thus formed electrode for an organic device, an electron injection function or a hole injection function can be realized with the conductive particles dispersed in the matrix of an organic compound. Accordingly, the application to an organic device is easy and the practical value is extremely high.

Further, it is desirable that the particle diameter of the conductive particles is 1 (nm) to 100 (nm) in an electrode for an organic device according to the invention.

Further, it is desirable that the conductivity of the conductive particles is $10^{-5}$ (S/m) or more.

In addition, an electrode for an organic device according to the invention may be included in an electronic device. As the electronic device, a cellular phone, a personal computer, a monitor, a video camera, a digital camera, a goggle type display, a navigation system, audio components, a car audio system, a game machine, a mobile computer, a portable game machine, an electronic book, and an image reproducing device equipped with a recording medium are given.

In order to solve the problems, a method of forming an electrode for an organic device which is an element using the properties of an organic compound according to the second invention is characterized in that the electrode for an organic device is formed by dispersing an organic compound and conductive particles which are a particulate inorganic compound in one solvent, and wet-coating a surface where the electrode for an organic device is formed, with the solution. According to the method of forming the thus formed electrode for an organic device, the diameter of the conductive particles and the amount of mixture can be controlled in advance so that the manufacture is easy and the quality does not vary. Besides, there is an advantage that an inorganic compound which is difficult to be deposited (inorganic compound with low vapor pressure) can be used as the conductive particles, and the selection of the material of the conductive particles can be expanded.

In order to solve the problems, a method of forming an electrode for an organic device which is a functional element using the properties of the organic compound according to the third invention is characterized in that the electrode for an organic device is formed by co-depositing a depositable organic compound and a depositable conductive inorganic compound on a surface where the electrode for an organic device is formed, controlling the weight ratio to be in the range of 4:1 to 1:4, thereby dispersing conductive particles of an excessive particulate conductive inorganic compound in a matrix of the organic compound. According to the method of forming the thus formed electrode for an organic device, there is an advantage that the weight rate in depositing the inorganic compound approaches that of the organic compound; thus, the controllability with weight ratio (controllability of using a crystal oscillator monitor) is increased. Further, there is also an advantage that in a vacuum container where no impurities other than the evaporation components of the organic compound and the inorganic compound exist, a very clean composition surface of the conductive inorganic compound and the organic compound can be formed.

Effects Of The Invention

As to the thus formed electrode for an organic device according to the present invention, the electron injection function and the hole injection function can be realized by the conductive particles dispersed in a matrix of the organic compound; thus, the application to an organic device is easy and the practical value is extremely high. Further, an electronic device including the electrode for an organic device according to the invention can be provided.

As to the method of forming the thus formed electrode for an organic device according to the second invention, the diameter of the conductive particles and the amount of mixture can be controlled in advance so that the manufacture is easy and the quality does not vary. Besides, there is an advantage that an inorganic compound which is difficult to be deposited (inorganic compound with low vapor pressure) can be used as the conductive particles, and the material of the conductive particles can be #widely selected.

As to the method of forming the thus formed electrode for an organic device according to the third invention, there is an advantage that the weight rate in depositing the inorganic compound approaches that of the organic compound; thus, the controllability with weight ratio (controllability of using a crystal oscillator monitor) is increased. Further, there is also an advantage that in a vacuum container where no impurities other than the evaporation components of the organic compound and the inorganic compound exist, a very clean composition surface of the conductive inorganic compound and the organic compound can be formed.

BEST MODE FOR CARRYING OUT THE INVENTION

Next, embodiment modes of each electrode for an organic device according to the present invention will be described in details referring to the attached drawings.

Figure 1:
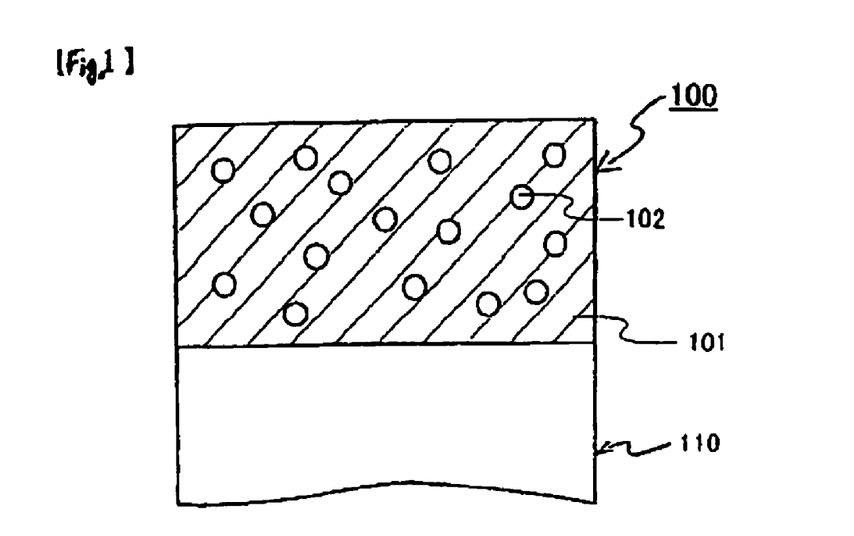
[FIG. 1]
A schematic cross-sectional view of an electrode for an organic device according to an embodiment mode of the present invention.

Shown in FIG. 1 is an electrode for an organic device 100 according to the present invention, that is a laminate in which a composite material in which conductive particles 102 of a particulate conductive inorganic material is dispersed in one or plural kinds of organic compounds 101 is formed and layered on the surface of an organic layer of the device where the electrode is formed. The diameter of the conductive particles 102 shall be 1 (nm) to 100 (nm), preferably, 1 (nm) to 20 (nm). That is, the electrode for an organic device 100 is the conductive particles 102 with unchanged properties of a conductive inorganic compound, which are dispersed in the organic compound 101; thus, the metal acts with the organic compound at the atomic level to cause a state like a metal complex. Thus, the state can be clearly distinguished from the state where a part where components retaining the original properties of the metal concentrates does not exist in the electrode.

As to the thus formed electrode for an organic device 100, since the densely dispersed conductive particles 102 have large specific surface area, interaction between the conductive particles 102 and the organic compound 101 realizes a function of a donor or an acceptor. Besides, since adhesion with the organic layer 110 is high due to the existence of the matrix of the organic compound 101, the electrode is suitable for an organic device. Note that in order to improve conductivity of the electrode for an organic device, a conductive inorganic compound with a conductivity $\delta$ of $10^{-5}$ (S/m) or more is desirably used.

As the organic compound 102 used for the electrode for an organic device 100, either one type of organic compound or mixed plural kinds of organic compounds may be used. Note that a π-conjugated organic compound is preferably used to help carriers move in the electrode for an organic device 100. As the π-conjugated organic compound, for example, a high molecular weight compound such as 4,4'-bis[N-(3-methylphenyl)-N-phenyl-amino]-biphenyl (abbreviation: TPD), 4,4'-bis[N-(1-naphthyl)-N-phenyl-amino]-biphenyl (abbreviation: α-NPD), 4,4', 4"-tris(N, N-diphenyl-amino)-triphenylamine (abbreviation: TDATA); and 4,4',4"-tris[N-(3-methylphenyl)-N-phenyl-amino]-triphenylamine (abbreviation: MTDATA), 2, 5-bis(1-naphtyl)-1,3,4-oxadiazole (abbreviation: BND), 2-(4-biphenylyl)-5-(4-tert-butylphenyl)-1,3,4-oxadiazole (abbreviation: PBD), 1,3-bis [5-(p-tert-butylphenyl)-1,3,4-oxadiazole-2-yl]benzene (abbreviation: OXD-7), 3-(4-tert-butylphenyl)-4-phenyl-5-(4-biphenylyl)-1,2,4-triazole (abbreviation: TAZ), bathophenanthroline (abbreviation: BPhen), bathocuproin (abbreviation: BCP), 2,2',2"-(1, 3,5-benzenetriyl)-tris[1-phenyl-1H-benzimidazole] (abbreviation: TPBI), tris(8-quinolinolate) aluminum (abbreviation: $Alq_3$), bis (10-hydroxy-benzo[h]-quinolinate)beryllium (abbreviation: $BeBq_2$), bis(2-methyl-8-quinolinolate)-4-phenylphenylato-aluminum (abbreviation: BAlq), bis[2-(2-hydroxyphenyl)-benzoxazolate]zinc (abbreviation: Zn $(Box)_2$), 4,4'-bis(N-carbazole)biphenyl (abbreviation: CBP), and 9,10-bis (2-naphthyl) anthracene (abbreviation: β-DNA); or a high molecular weight organic compound such as poly (vinyltriphenylamine) (abbreviation: PVT), poly (N-vinylcarbazole (abbreviation: PVK), poly (2,5-dialkoxy-1.4-phenylenevinylene) (abbreviation: RO-PPV), poly (2,5-dialkoxy-1,4-phenylene) (abbreviation: RO-PPP), poly (9,9-dialkylfluorene) (abbreviation: PDAF), and poly[3-alkylthiophene] (abbreviation: PAT) are given.

Meanwhile, as the conductive particles 102, as well as one or plural kinds of metals such as main group metal, transition metal, and lanthanoid, or alloys (specifically, Li, Mg, Ca, Al, Ag, Au, Cu, Pt, and the like); inorganic compounds other than metal (specifically, $Mg_3N_2$, $Ca_3N_2$, ITO, ZnO, NiO, $MoO_3$, $V_2O_5$, ZnS, CdS, CdSe, CuI, and the like) such as inorganic compounds containing group 15 elements (nitride, phosphide, arsenide), inorganic compounds containing group 16 elements (oxide, sulfide, selenide, telluride), inorganic compounds containing group 17 elements (bromide, iodide); conductors which are transparent in the visible region (Rh, Pd, Cr, $SiO_2$, $In_2O_3$, CdO, $TiO_2$, $ZnSnO_4$, $MgInO_4$, $CaGaO_4$, TiN, ZrN, HfN, $LaB_6$ and the like) can be used.

The electrode for an organic device according to the invention has wide application range and it can be specialized for an electron injection function, a hole injection function, or may have both electron injection function and hole injection function.

Figure 2:
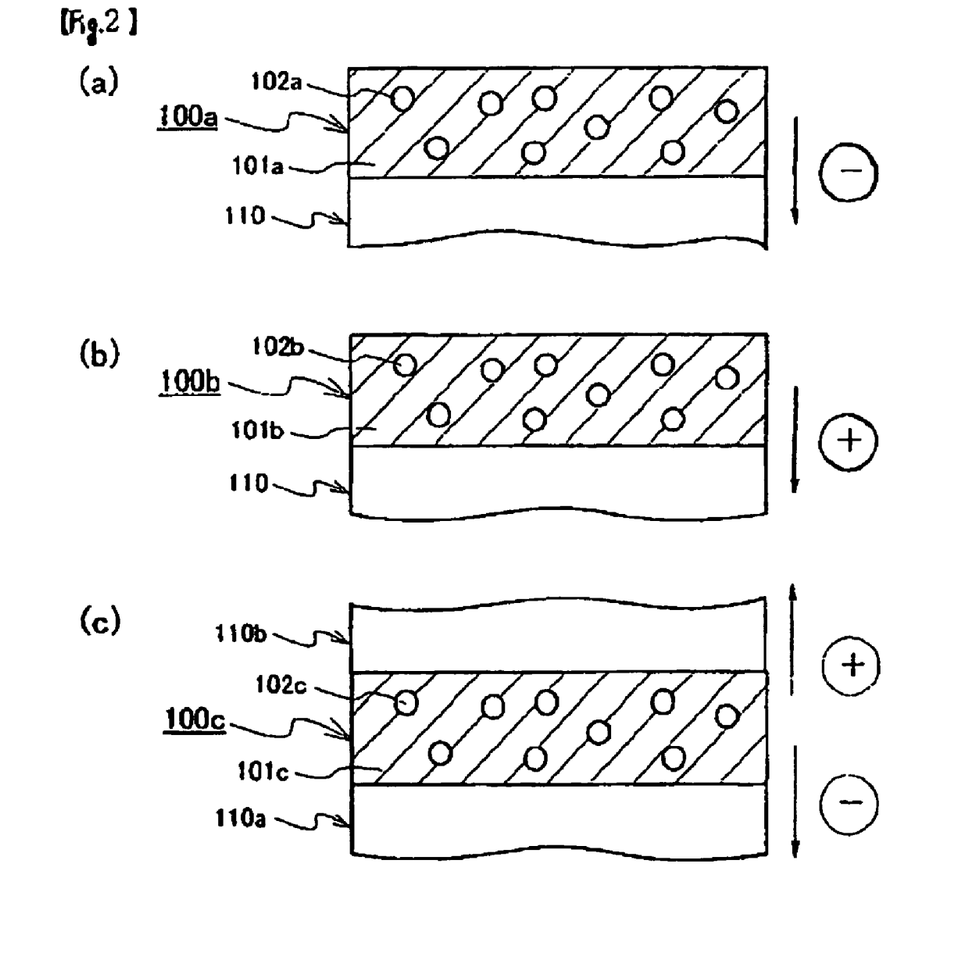
[FIG. 2]
A figure explaining an electron injection function and a hole injection function in accordance with the electrode structure.

An electrode for an organic device 100*a* shown in FIG. 2(*a*) realizes a function of injecting electrons into an organic layer 110 of the organic device by using a conductive inorganic compound having a work function of 4.2 (eV) or less (for example, Li, Mg, Ca, $Mg_3N_2$, $Ca_3N_2$, and the like) or a semiconductor displaying n-type (for example, ZnO, ZnS, CdS, CdSe, and the like) for conductive particles 102*a* dispersed in a matrix of an organic compound 101*a*. Note that as the organic compound 101*a*, an electron transporting organic compound (for example, BND, PBD, OXD-7, TAZ, BPhen, BCP, TPBI, $Alq_3$ $BeBq_2$, BAlq, $Zn(BOX)_2$, or the like) is desirably used.

An electrode for an organic device 100*b* shown in FIG. 2(*b*) realizes a function of injecting holes into an organic layer 110 of the organic device by using a conductive inorganic compound having a work function of more than 4.2 (eV) (for example, Ag, Au, Cu, Pt, ITO, and the like) or a semiconductor displaying p-type (for example, NiO, $MoO_3$, $V_2O_5$, and the like) for conductive particles 102*b* dispersed in a matrix of an organic device 101*b*. Note that as the organic compound 101*b*, a hole transporting organic compound (for example, TPD, α-NPD, TDATA, MTDATA, PVT, PVK, or the like) is desirably used.

An electrode for an organic device 100*c* shown in FIG. 2(*c*) realizes functions of injecting electrons into a first organic layer 110*a* and injecting holes into a second organic layer 110*b* of the organic device in accordance with the voltage applied from the first organic layer 110*a* to the second organic layer 110*b* by mixing appropriate proportion of a conductive inorganic compound having a work function of 4.2 (eV) or less (for example, Li, Mg, Ca, $Mg_3N_2$, $Ca_3N_2$, and the like) or a semiconductor displaying n-type (for example, ZnO, ZnS, CdS, CdSe, and the like); and a conductive inorganic compound having a work function of more than 42 (eV) (for example, Ag, Au, Cu, Pt, ITO, and the like) or a semiconductor displaying p-type (for example, NiO, $MoO_3$, $V_2O_5$, and the like) for conductive particles 102*c* dispersed in a matrix of an organic device 101*c*. Note that a bipolar π-conjugated organic compound is desirably used as the organic compound 101*c*.

Next, a method of forming the above described electrode for an organic device will be described in details.

A first forming method is a method in which an organic compound and conductive particles of a particulate conductive inorganic compound are dispersed in one solvent, and a surface where the electrode for an organic device is formed is wet coated (by dip coating, spin coating, ink-jet, or the like) with the solution to form the electrode for an organic device. According to the method, the diameter of the conductive particles and the amount of mixture can be controlled in advance so that the manufacture is easy and the quality does not vary. Besides, there is an advantage that an inorganic compound which is difficult to be deposited (inorganic compound with low vapor pressure) can be used as the conductive particles, and the width of the selection of the material of the conductive particles can be expanded. Note that generally, it is difficult to form a membranous material by uniformly mixing a particulate a metal or an inorganic compound with an organic compound in many cases; however, the dispersibility can be improved by treating the surface of a metal or an inorganic compound with a surface stabilizer such as alkylthiol or trichloroalkylsilane in advance. Further, in the case of forming an electrode for an organic device from metal or an inorganic compound which is easily air-oxidized, a conductive inorganic compound may be produced in an organic solvent by reaction under an inert atmosphere, mixed dispersed solution with an organic compound may be prepared after the conductive inorganic compound is grown to particles, and the electrode may be formed as a membranous material by wet-coating.

A second formation method is a method in which an electrode for an organic device is formed by co-depositing a depositable organic compound and a depositable conductive inorganic compound on a surface where the electrode for an organic device is formed controlling the weight ratio to be in the range of 4:1 to 1:4, thereby dispersing conductive particles of an excessive particulate conductive inorganic compound in a matrix of the organic compound. Accordingly, in this formation method, co-deposition is performed at a molar ratio of the organic compound and the inorganic compound about 1:1; thus, the metal acts with the organic compound at the atomic level to cause a state like a metal complex. Further, not the state where a part where components retaining the original properties of the metal does not exist, but the state where co-deposition is performed controlling the weight ratio of conductive inorganic compound/organic compound to be 1/4 or more (preferably, 1/2 or more) and 4/1 or less (preferably, 2/1 or less), so that the conductive particles are dispersed in a matrix of the organic compound is made. According to the method, there is an advantage that the weight rate in depositing the inorganic compound approaches that of the organic compound; thus, the controllability with weight ratio (controllability of using a crystal oscillator monitor) is enhanced. Further, there is also an advantage that in a vacuum container where no impurities other than the evaporation components of the organic compound and the inorganic compound exist, a very clean composition surface of the conductive inorganic compound and the organic compound can be formed.

Figure 3:
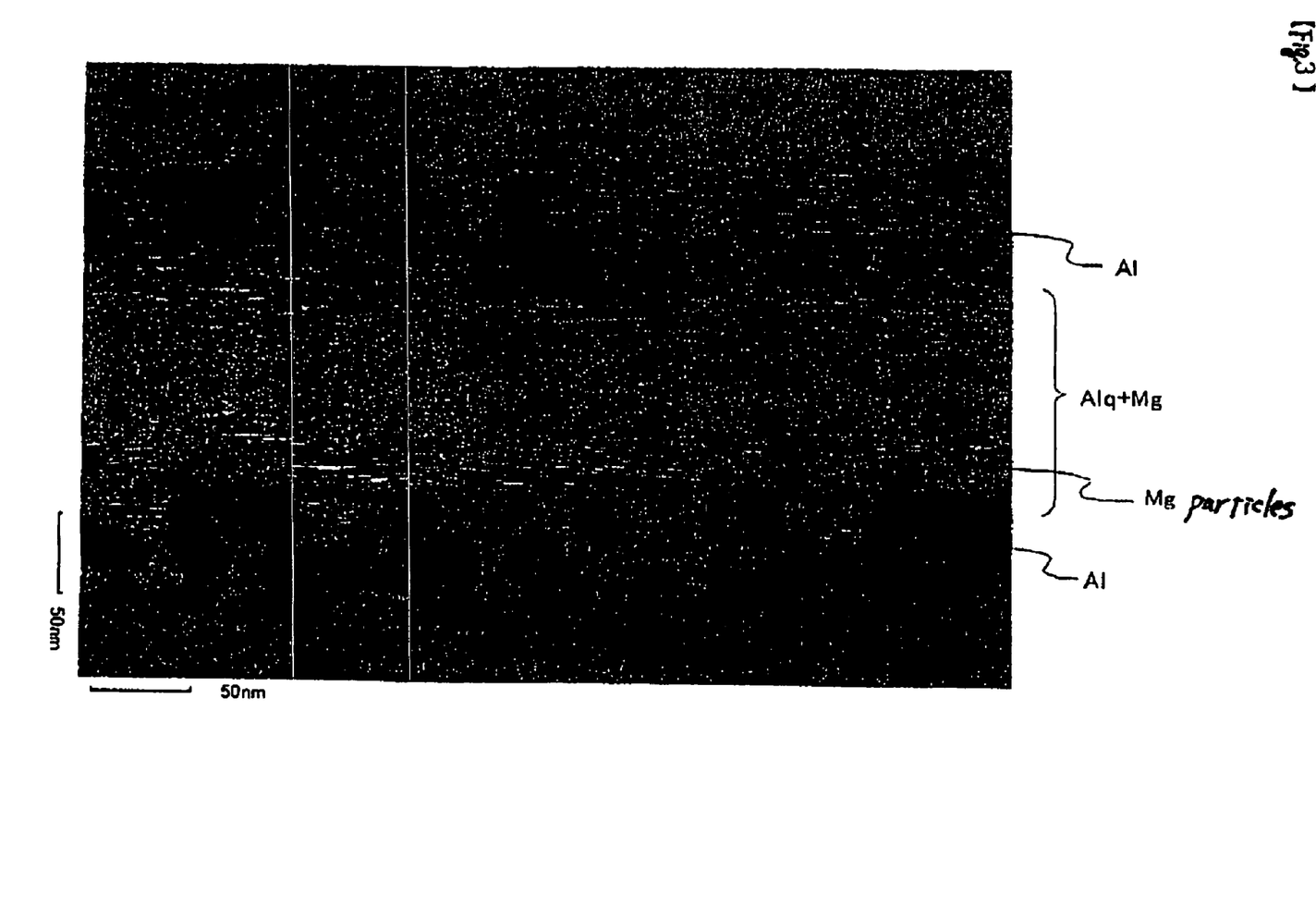
[FIG. 3]
A cross-sectional TEM micrograph of an electrode for an organic device.

A cross-sectional TEM micrograph of an electrode for an organic compound formed according to the above second method is shown in FIG. 3. This is a structure in which "Al/the electrode for an organic device/Al" are laminated in order, and the deposition rate of Mg used as a conductive inorganic compound is fixed to 0.1 (nm/s), $Alq_3$ used as an organic compound is also evaporated, and co-deposition of Mg and Alq is performed controlling the total deposition rate to 0.2 (nm/s). That is, the proportion of Mg and $Alq_3$ is conditioned to be 1:1 by weight. However, the deposition rate of an Mg component tends to increase in initial stage of the evaporation of the both components, and Mg would be excessively supplied on the side very close to the Al film formed over a substrate. In the cross-sectional TEM micrograph, shadows of about several nm to ten and several run diameter are observed in an electrode layer directly on an Al film on the substrate side. This is considered to be a metal crystal since it displays nonuniform contrast. Thus, it is confirmed that microcrystal of Mg (that is, conductive particles) can be formed in a dispersed manner in a matrix of the organic compound. Note that Mg particles above the areas where nonuniform contrast is observed cannot be observed directly; however, Mg particles with a diameter of several nm or less are supposed to be formed on the areas.

[Structural Example of Organic Device 1]

Next, as a structural example 1 of an organic device composed using the electrode for an organic device described above, an example of the application to an organic EL element will be described. The element structure is shown in FIG. 4(*a*).

Figure 4:
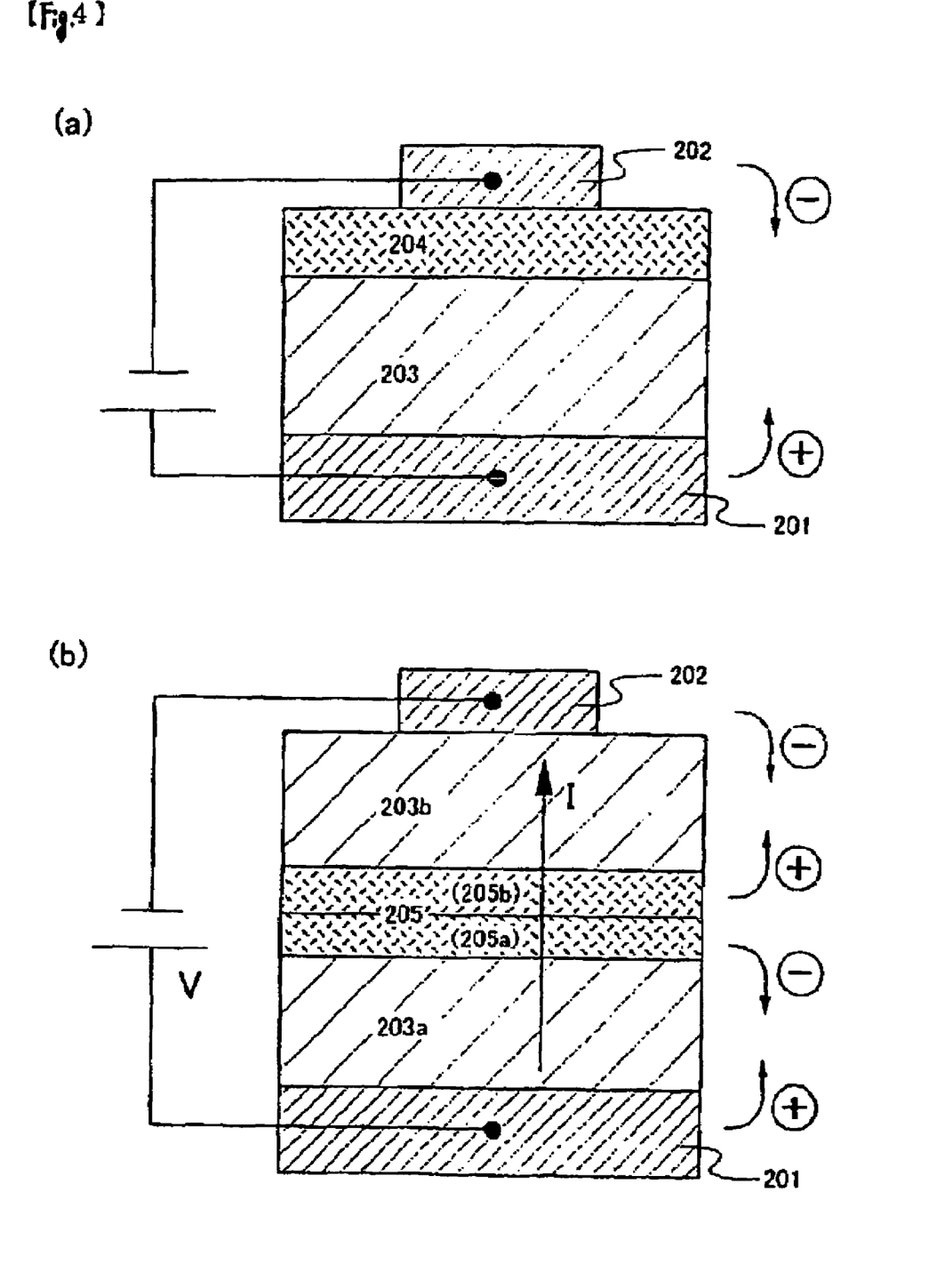
[FIG. 4]
A diagram showing the characteristics of an organic EL element using an electrode for an organic device according to the present invention.

FIG. 4(*a*) shows an organic EL element using an electrode for an organic device (a type shown in FIG. 2(*a*) described above) having an electron injection function as an electron injection electrode. Reference numeral 201 denotes an anode, 202 denotes a cathode, 203 denotes an electroluminescent layer, 204 denotes an electron injection electrode. In addition, the electroluminescent layer 203 is a layer containing an organic compound which is capable of electroluminescence or light emission by carrier injection. FIG 4(b) shows an organic EL element (MPE element) incorporating an electrode for an organic device having both electron injection function and hole injection function (an electrode shown in FIG 2(c) or an electrode having a laminated structure of electrodes shown in FIG 2(a) and FIG. 2(b), and reference numeral 201 denotes an mode, 202 denotes a cathode, 203a denotes a first electroluminescent layer, 203b denotes a second electroluminescent layer, and 205 denotes a charge generation layer including an electron injection electrode layer 205a, and a hole injection electrode layer 205b. In addition, the first electroluminescent layer 203a and the second electroluminescent layer 203b are capable of electroluminescence or contains an organic compound which can emit light by carrier injection. Further, the charge generation layer 205 is not connected with an external circuit, and serves as a floating internal electrode.

[Structural Example of Organic Device 1]

An example of forming an organic EL element using an electrode for an organic device according to the present invention as an electron injection electrode of an organic EL element described above will be described.

First, a glass substrate on which ITO to be used as an anode 201 is patterned is washed with boiling ethanol. Further, the substrate surface is washed with an ozone plasma cleaner. The washed substrate and a material to be deposited are set inside a vacuum deposition system, and thereafter the pressure in the chamber is reduced to about $10^{-4}$ (Pa).

After the intended degree of vacuum is obtained, first, TPD was deposited in a rate of about 0.2 to 0.4 (nm/s) to form the film of 70 nm. Subsequently, $Alq_3$ was deposited in a rate of about 0.2 to 0.4 (nm/s) to form the film of 60 (nm). The above becomes the electroluminescent layer 203.

Next, as the deposition rate of Mg is fixed to 0.1 (nm/s), $Alq_3$ is also evaporated to co-deposit Mg and $Alq_3$. At this time, the total deposition rate is controlled to be 0.2 (nm/s); therefore, the ratio of Mg and $Alq_3$ is 1:1 by weight. Accordingly, the same structure as the electrode for an organic device of the invention shown in FIG. 3 can be acquired. Further, since Mg which is a conductive inorganic compound having a work function of 4.2 (eV) or less for conductive particles, it acts as an electron injection electrode 205. The electron injection electrode 205 is formed to 10 (nm). Subsequently, Al is deposited to 80 (nm) in a deposition rate of about 0.2 to 0.4 nm/s to be a cathode 202.

Figure 5:
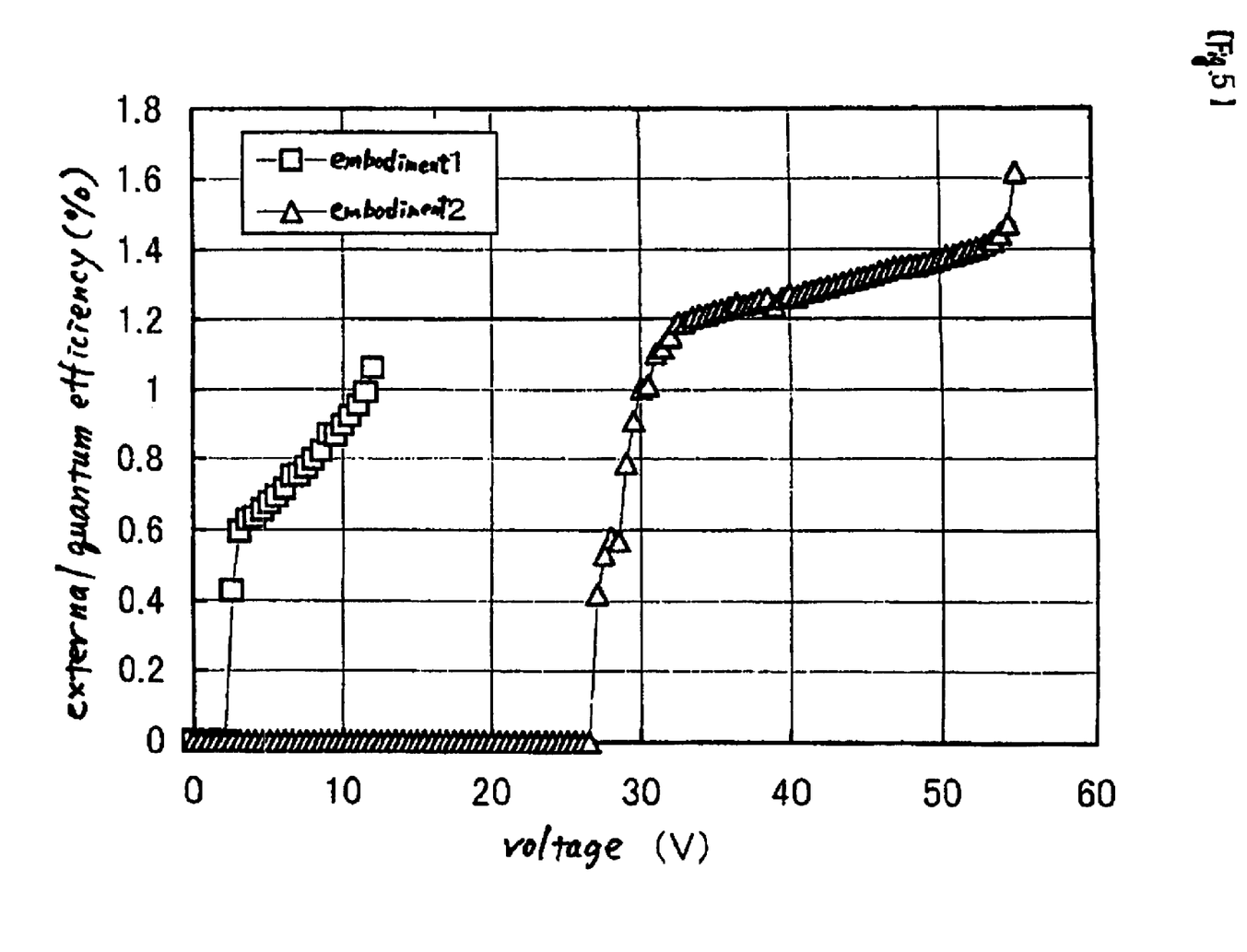
[FIG. 5]
A diagram showing the characteristics of an organic EL element using an electrode for an organic device according to the present invention.

The element characteristics of the organic EL element formed as above are shown in FIG. 5 (embodiment 1 in the figure). The horizontal axis indicates current density (V), and the vertical axis indicates external quantum efficiency (%: the number of extracted photons/the number of injected carriers). The external quantum efficiency in light emission is about 0.6 to 1.1%.

[Structural Example of Organic Device 2]

As a structural example 2 of an organic device formed using the electrode for an organic device described above, the application to another organic EL element will be described. The element structure is shown in FIG. 4(b).

FIG. 4(b) is a known organic EL element (MPE element) incorporating an electrode for an organic device having both electron injection function and hole injection function (an electrode shown in FIG. 2(c) or an electrode having a laminated structure of electrodes shown in FIG. 2(a) and FIG. 2(b)), and reference numeral 201 denotes an anode, 202 denotes a cathode, 203a denotes a first electroluminescent layer, 203b denotes a second electroluminescent layer, and 205 denotes a charge generation layer including an electron injection electrode layer 205a, and a hole injection electrode layer 205b. In addition, the first electroluminescent layer 203a and the second electroluminescent layer 203b are capable of electroluminescence or contains an organic compound which can emit light by carrier injection. Further, the charge generation layer 205 is not connected with an external circuit, and serves as a floating internal electrode.

As to an organic EL element having the above structure, in the case of applying voltage between an anode 201 and a cathode 202, electrons are injected into the first electroluminescent layer 203a from the electron injection electrode layer 205a of the charge generation layer 205, and holes are injected into the second electroluminescent layer 203b from the hole injection electrode layer 205b of the charge generation layer 205. Meanwhile, seen from an external circuit, holes are injected into the first electroluminescent layer 203a from the anode 201, and electrons are injected into the second electroluminescent layer 203b from the cathode; thus, carrier recombination occurs both in the first electroluminescent layer 203a and the second electroluminescent layer 203b, which leads to light emission. On this occasion, if current I flows, both the first electroluminescent layer 203a and the second electroluminescent layer 203b can emit photons of the amount corresponding to the current I. Accordingly, as compared with an organic EL element having only one electroluminescent layer, it has an advantage of emitting twice the amount of light by the same current.

Note that in this structural example, two layers of electroluminescent layers are laminated in a charge generation layer; further, current efficiency can be improved multiple times by laminating more electroluminescent layers (by interposing each charge generation layers between each electroluminescent layers).Theoretically, great enhancement also relating to element lifetime in addition to the improvement in current efficiency is expected. However, as the number of laminated electroluminescent layers is increased, high voltage is required to apply the same current I.

[Embodiment 2V of Organic EL Element]

As the charge generation layer of an organic EL element (MPE element) described above, an example of forming an organic element using an electrode for an organic device according to the invention will be described.

First, a glass substrate on which ITO to be used as an anode 201 is patterned is washed with boiling ethanol. Further, the substrate surface was washed with an ozone plasma cleaner. The washed substrate and a material to be deposited were set inside a vacuum deposition system, and thereafter the pressure in the chamber was reduced to about $10^{-4}$ Pa.

After the intended degree of vacuum is obtained, first, TPD was deposited in a rate of about 0.2 to 0.4 nm/s to form the film of 70 nm. Subsequently, $Alq_3$ was deposited in a rate of about 0.2 to 0.4 nm/s to form the film of 60 nm. The above becomes the first electroluminescent layer 203a.

Next, as the deposition rate of Mg is fixed to 0.1 nm/s, Alq was also evaporated to co-evaporate Mg and $Alq_3$. At this time, the total deposition rate was controlled to be 0.2 nm/s; therefore, the ratio of Mg and $Alq_3$ is 1:1 by weight. Note that the co-deposited layer is formed to 10 nm. Further, as the deposition rate of Au is fixed to 0.1 nm/s, TPD is also evaporated to co-evaporate Au and TPD. At this time, the total deposition rate is controlled to be 0.2 nm/s; therefore, the ratio of Au and TPD is 1:1 by weight. Note that the co-deposited layer was formed to 10 nm. The total 20 nm of the co-deposited layer is the electrode for an organic device according to the invention, and it acts as the charge generation layer 205.

On the thus formed charge generation layer 205, a second electroluminescent layer 203b in which TPD (70 nm) and Alq$_3$ (60) are laminated is formed as well as the first electroluminescent layer 203a. Further, in the like manner as above, Mg and Alq were co-deposited to be 1:1 by weight to form 10 nm co-deposited layer. Next, Al was deposited to 80 nm in a deposition rate of about 0.2 to 0.4 nm/s to form the cathode 202.

The characteristics of a multiphoton emission element (ITO/TPD (70 nm)/Alq$_3$ (60 nm)/Mg: Alq$_3$ (10 nm)/Au:TPD (10 rn)/TPD (70 nm)/Alq3 (60 nm)/Mg:Alq$_3$ (10 nm)/Al (80 nm)) are shown in FIG. 5 (Embodiment 2 in the figure). The external quantum efficiency in light emission is about 1.2 to 1.6%.

As a result of this, as to the element shown as the Embodiment 2, the drive voltage is increased as compared with the element in Embodiment 1, meanwhile the external quantum efficiency is higher than that of the element in Embodiment 1; thus, it is found that the element acts as a multiphoton light emission element. Accordingly, when an electrode for an organic device according to the invention is made to have the structure in the Embodiment 2, it was proved that the electrode for an organic device according to the invention serves as a charge generation layer, and carriers of both holes and electrons can be injected.

[Structural Example of Organic Device 3]

Next, as a structural example 3 of an organic device formed using an electrode for an organic device according to each Embodiment Mode described above, the application to an organic field effect transistor will be described. The element structure is shown in FIG. 6.

Figure 6:
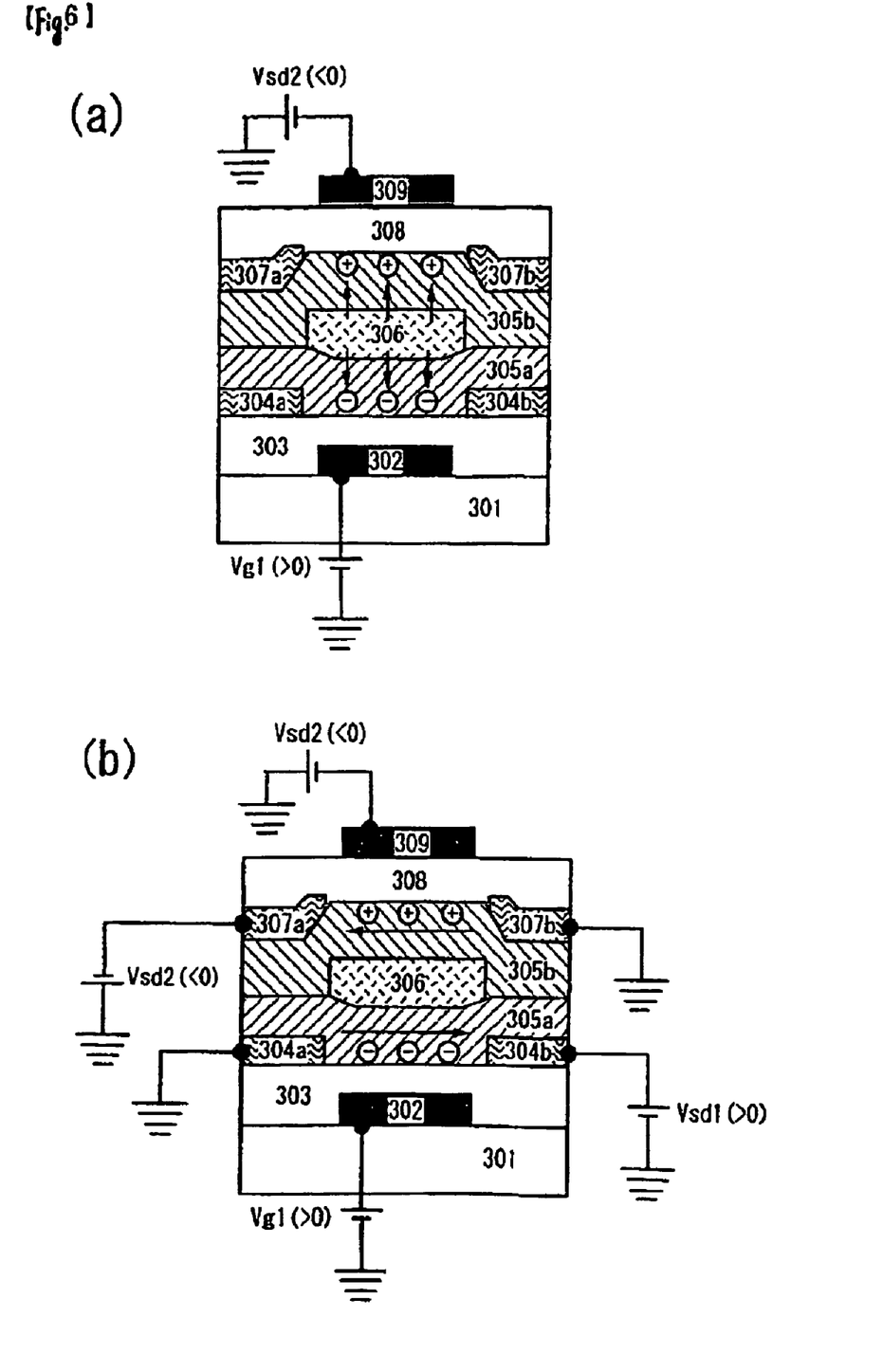
[FIG. 6]
A schematic cross-sectional view of an organic field effect transistor using an electrode for an organic device according to the present invention.

FIG. 6(*a*) shows an organic field effect transistor incorporating a charge generation layer as an internal electrode, comprising a substrate 301, a first gate electrode 302, a first gate insulating film 303, a first source electrode 304a, a first drain electrode 304b, an electron transport layer 305a using an organic compound with electron transport properties, a hole transport layer 305b using an organic compound with hole transport properties, a charge generation layer 306, a second drain electrode 307a, a second source electrode 307b, a second gate insulating film 308, and a second gate electrode 309. Note that hereinafter, the electron transport layer 305a and the hole transport layer 305b are collectively referred to as an organic semiconductor layer.

With this structure, when Vg1 (>0) is applied to the first gate electrode 302 and Vg2 (<0) is applied to the second gate electrode 309, as shown in FIG. 3(*a*), electrons are injected into the electron transport layer 305a and holes are injected into the transport layer 305b from the charge generation layer 306 with field effect, respectively. Meanwhile, carriers are not to be injected into the organic semiconductor film from the first gate electrode 302 and the second gate electrode 309 for the existence of the first gate insulating film 303 and the second gate insulating film 308. Accordingly, electrons are accumulated in the organic semiconductor layer in the vicinity of the surface of the first gate insulating film 303, and holes are accumulated in the vicinity of the surface of the second gate insulating film 308, respectively; thus, charge accumulated channel layers for respective electrons and holes are formed.

On this occasion, as shown in FIG. 3(*b*), Vsd1 (>0) is applied between the first source electrode 304a and the first drain electrode 304b, and Vsd2 (<0) is applied between the second source electrode 307b and the second drain electrode 307a. Then the electrons in the electron accumulated layer in the vicinity of the first gate insulating film 303 and the holes in the hole accumulated layer in the vicinity of the second insulating film 308 make current flow through the each source-drain circuit.

Generally, as to an organic field effect transistor, the amount of current flowing between source-drain electrodes is perceived to depend on the amount of charges injected from the source electrode, which limits the amount of the control current, and high speed operation of the organic field effect transistor. As to the organic field effect transistor using the above charge generation layer, not the charge injected from the source electrode, but the charges generated in the charge generation layer by filed application are used; thus, an advantage of controlling a large amount of current at high speed can be obtained. Correspondingly, the charge generation layer is required to have a function of injecting holes upward and injecting electrons downward. Thus, when the electrode for an organic device is used as the electron generation layer 306 (internal charge generation layer), the above organic field effect transistor can be obtained.

EXPLANATION OF REFERENCE NUMERALS

100: an electrode for an organic device, 101: an organic compound, 102: conductive particles, 110: an organic layer

The invention claimed is:

1. An electrode used for an organic device,
   wherein said electrode comprises a composite material in which conductive particles constituting a conductive inorganic compound are dispersed in a matrix including a pi-conjugated organic compound,
   wherein the conductive inorganic compound is selected from the group consisting of an inorganic nitride, an inorganic phosphide, an inorganic sulfide, an inorganic selenide, and an inorganic telluride, and
   wherein a weight ratio of the conductive inorganic compound to the pi-conjugated organic compound is more than ½ and less than 4/1.

2. The electrode for the organic device according to claim 1,
  wherein a particle diameter of one of the conductive particles is 1 nm to 100 nm.

3. The electrode for the organic device according to claim 1,
  wherein a conductivity of the conductive inorganic compound is $10^{-5}$ S/m or more.

4. An electronic device comprising the electrode for the organic device according to claim 1,
  wherein the electronic device is one selected from the group consisting of a cellular phone, a personal computer, a monitor, a video camera, a digital camera, a goggle type display, a navigation system, audio components, a car audio system, a game machine, a mobile computer, a portable game machine, an electronic book, and an image reproducing device equipped with a recording medium.

5. A method of forming an electrode for an organic device, the method comprising:
  dispersing pi-conjugated organic compound and conductive particles constituting a conductive inorganic compound in a solvent,
  wherein the conductive inorganic compound is selected from the group consisting of an inorganic nitride, an inorganic phosphide, an inorganic sulfide, an inorganic selenide, and an inorganic telluride; and
  wet-coating on a surface where the electrode for the organic device is formed, with a solution comprising the organic compound, the conductive particles, and the solvent to form the electrode for the organic device,
  wherein a weight ratio of the conductive inorganic compound to the pi-conjugated organic compound is more than ½ and less than 4/1.

6. A method of forming an electrode for an organic device, the method comprising:
  co-depositing a pi-conjugated organic compound and a conductive inorganic compound on a surface where the electrode for the organic device is formed to form the electrode for the organic device where a weight ratio of the conductive inorganic compound to the organic compound is more than ½ and less than 4/1,
  wherein the conductive inorganic compound is selected from the group consisting of an inorganic nitride, an inorganic phosphide, an inorganic sulfide, an inorganic selenide, and an inorganic telluride, and
  wherein the conductive inorganic compound is dispersed in a matrix of the pi-conjugated organic compound.

7. An organic EL element comprising the electrode for the organic device according to claim 1.

8. An organic field effect transistor comprising the electrode for the organic device according to claim 1.

9. A semiconductor device comprising:
  a first electroluminescent layer comprising a pi-conjugated organic material;
  a second electroluminescent layer adjacent to the first electroluminescent layer, the second electroluminescent layer comprising a pi-conjugated organic material; and
  an electrode provided between the first electroluminescent layer and the second electroluminescent layer,
  wherein the electrode comprises a composite material in which conductive particles constituting a first conductive inorganic compound of which a work function is 4.2 eV or less and a second conductive inorganic compound of which a work function is more than 4.2 eV are dispersed in a pi-conjugated organic compound,
  wherein the first conductive inorganic compound and the second conductive inorganic compound are selected from the group consisting of an inorganic nitride, an inorganic phosphide, an inorganic sulfide, an inorganic selenide, and an inorganic telluride, and
  wherein a weight ratio of the first conductive inorganic compound and the second conductive inorganic compound to the pi-conjugated organic compound is more than ½ and less than 4/1.

10. The semiconductor device according to claim 9,
  wherein a particle diameter of one of the conductive particles is 1 nm to 100 nm.

11. The semiconductor device according to claim 9,
  wherein a conductivity of at least one of the first and second conductive inorganic compounds is $10^{-5}$ S/m or more.

12. The semiconductor device according to claim 9,
  wherein the semiconductor device is one selected from the group consisting of a cellular phone, a personal computer, a monitor, a video camera, a digital camera, a goggle type display, a navigation system, audio components, a car audio system, a game machine, a mobile computer, a portable game machine, an electronic book, and an image reproducing device equipped with a recording medium.

13. A semiconductor device comprising:
  a first electroluminescent layer comprising a pi-conjugated organic material;
  a second electroluminescent layer adjacent to the first electroluminescent layer, the second electroluminescent layer comprising a pi-conjugated organic material; and
  an electrode provided between the first electroluminescent layer and the second electroluminescent layer, the electrode comprising:
  an electron injection electrode layer in which a first conductive inorganic compound of which a work function is 4.2 eV or less is dispersed in a first pi-conjugated organic compound; and a hole injection electrode layer in which a second conductive inorganic compound of which a work function is more than 4.2 eV is dispersed in a second pi-conjugated organic compound which is different from the first pi-conjugated organic compound,
  wherein a weight ratio of the first conductive inorganic compound to the said first organic compound is more than ½ and less than 4/1,
  wherein a weight ratio of the second conductive inorganic compound to the said second organic compound is more than ½ and less than 4/1, and
  wherein the first conductive inorganic compound and the second conductive inorganic compound are selected from the group consisting of an inorganic nitride, an inorganic phosphide, an inorganic sulfide, an inorganic selenide, and an inorganic telluride.

14. The semiconductor device according to claim 13,
  wherein a particle diameter of at least one of the first and second conductive inorganic compounds is 1 nm to 100 nm.

15. The semiconductor device according to claim 13,
  wherein a conductivity of at least one of the first and second conductive inorganic compounds is $10^{-5}$ S/m or more.

16. The semiconductor device according to claim 13,
  wherein the semiconductor device is one selected from the group consisting of a cellular phone, a personal computer, a monitor, a video camera, a digital camera, a goggle type display, a navigation system, audio components, a car audio system, a game machine, a mobile computer, a portable game machine, an electronic book, and an image reproducing device equipped with a recording medium.

17. The electrode for the organic device according to claim 1, wherein a work function of the conductive inorganic compound is 4.2 eV or less.

18. The electrode for the organic device according to claim 1, wherein a work function of the conductive inorganic compound is more than 4.2 eV.

* * * * *